United States Patent
Yoshino

(10) Patent No.: US 11,119,059 B2
(45) Date of Patent: Sep. 14, 2021

(54) SEMICONDUCTOR DEFECT INSPECTION APPARATUS AND SEMICONDUCTOR DEFECT INSPECTION METHOD

(71) Applicant: TOSHIBA MEMORY CORPORATION, Tokyo (JP)

(72) Inventor: Kiminori Yoshino, Kuwana Mie (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 66 days.

(21) Appl. No.: 16/530,270

(22) Filed: Aug. 2, 2019

(65) Prior Publication Data
US 2020/0271600 A1 Aug. 27, 2020

(30) Foreign Application Priority Data
Feb. 27, 2019 (JP) .............................. JP2019-034801

(51) Int. Cl.
*G01N 23/223* (2006.01)
*G01N 23/083* (2018.01)
*G01N 23/18* (2018.01)

(52) U.S. Cl.
CPC .......... *G01N 23/223* (2013.01); *G01N 23/083* (2013.01); *G01N 23/18* (2013.01); *G01N 2223/076* (2013.01); *G01N 2223/6116* (2013.01)

(58) Field of Classification Search
CPC ......... G01N 2223/04; G01N 2223/076; G01N 2223/6116; G01N 2223/646; G01N 23/18; G01N 23/2206; G01N 23/223; G01N 23/083; H01L 22/12
See application file for complete search history.

(56) References Cited

U.S. PATENT DOCUMENTS

| 6,324,298 B1* | 11/2001 | O'Dell | G01N 21/9501 |
| | | | 257/E21.53 |
| 2004/0101099 A1* | 5/2004 | Horai | G01N 23/223 |
| | | | 378/58 |
| 2013/0034204 A1* | 2/2013 | Matoba | G01N 23/223 |
| | | | 378/44 |
| 2013/0114074 A1* | 5/2013 | Nakajima | H01L 21/681 |
| | | | 356/237.5 |

(Continued)

FOREIGN PATENT DOCUMENTS

| JP | 2759922 B | 5/1998 |
| JP | 2004-093511 A | 3/2004 |
| JP | 2013-036793 A | 2/2013 |

*Primary Examiner* — Dani Fox
*Assistant Examiner* — Soorena Kefayati
(74) *Attorney, Agent, or Firm* — Foley & Lardner LLP

(57) ABSTRACT

According to one embodiment, a semiconductor defect inspection apparatus includes: an object-under-examination stage on which an inspection target object is placed; an X-ray irradiation unit that irradiates the object-under-examination stage with X-rays; an imaging unit that detects transmitted X-rays which passed through the inspection target object; a fluorescent X-ray detection unit that detects fluorescent X-rays which are emitted from the inspection target object by irradiation with the X-rays; and a defect detection unit that detects a first defect by an analysis of a transmission X-ray image which is obtained by performing photoelectric conversion of the transmitted X-rays and detects a second defect by a spectrum analysis of the fluorescent X-rays.

9 Claims, 9 Drawing Sheets

(56) References Cited

U.S. PATENT DOCUMENTS

| | | | |
|---|---|---|---|
| 2015/0051877 A1* | 2/2015 | Bakeman | G01N 23/223 |
| | | | 703/1 |
| 2015/0253263 A1* | 9/2015 | Feser | G01N 23/046 |
| | | | 378/6 |
| 2016/0169819 A1* | 6/2016 | Usui | H01J 37/222 |
| | | | 250/307 |
| 2016/0275365 A1* | 9/2016 | Yoshikawa | G06T 3/40 |
| 2016/0293502 A1* | 10/2016 | Pirkle | H01L 22/12 |
| 2016/0377561 A1* | 12/2016 | Ramachandran | |
| | | | G01N 21/95607 |
| | | | 250/307 |
| 2017/0249753 A1* | 8/2017 | Otani | H04N 5/23245 |
| 2017/0261441 A1* | 9/2017 | Nakao | G01N 23/18 |
| 2017/0363969 A1* | 12/2017 | Hauptmann | G01N 21/9501 |
| 2018/0003652 A1* | 1/2018 | Uher | G06T 7/62 |
| 2018/0114732 A1* | 4/2018 | Bell | G01N 21/9501 |
| 2018/0202947 A1* | 7/2018 | Urano | G01N 23/10 |
| 2018/0209924 A1* | 7/2018 | Sasazawa | G01N 23/083 |
| 2019/0025231 A1* | 1/2019 | Jakubek | G01N 23/04 |
| 2019/0079025 A1* | 3/2019 | Hasegawa | G01N 23/203 |
| 2019/0145913 A1* | 5/2019 | Fukuda | G01N 23/04 |
| | | | 378/58 |
| 2019/0170659 A1* | 6/2019 | Kaneko | G01N 23/04 |
| 2019/0187077 A1* | 6/2019 | Lee | G01N 23/223 |

* cited by examiner

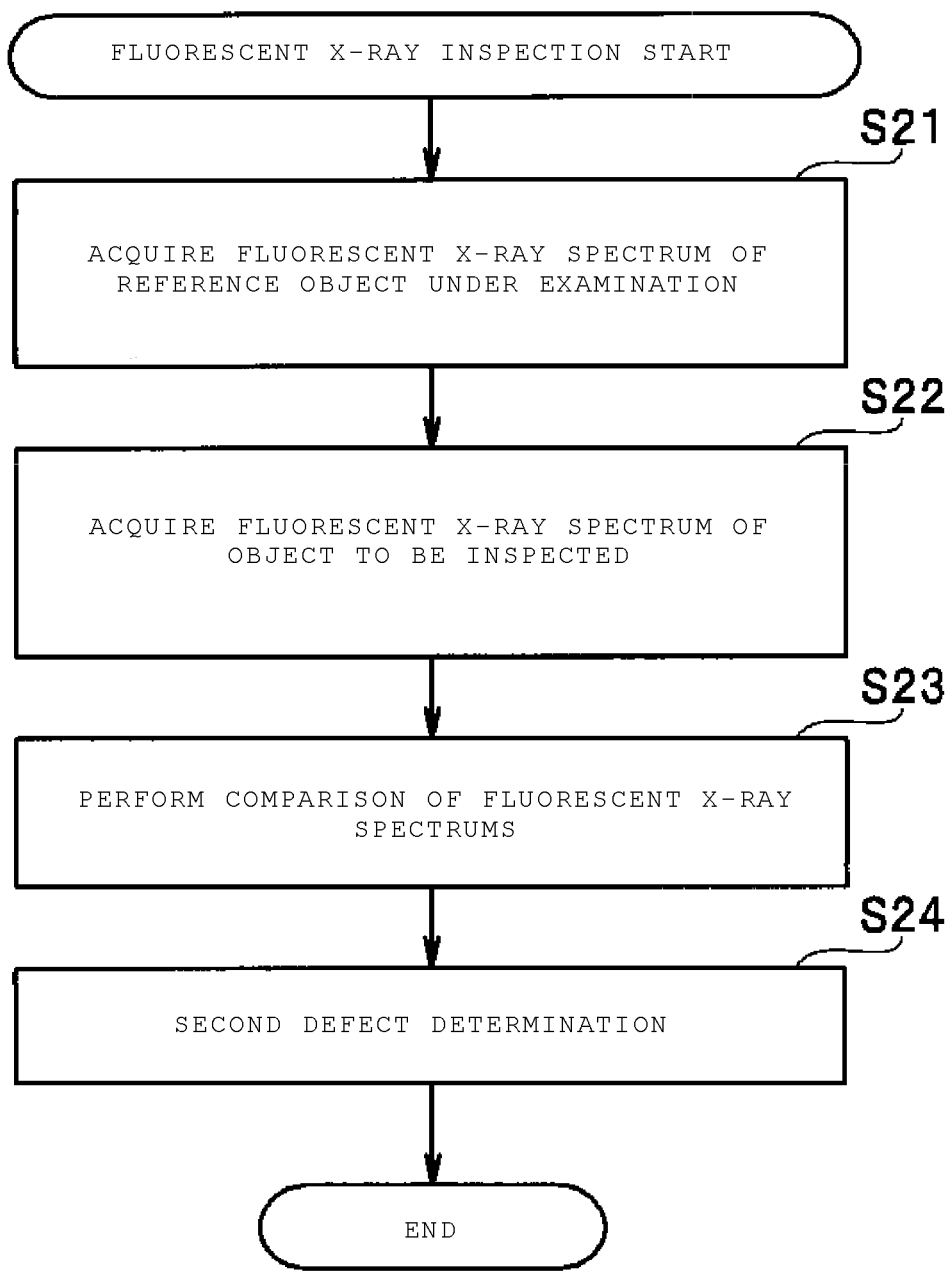

SEMICONDUCTOR DEFECT INSPECTION APPARATUS AND SEMICONDUCTOR DEFECT INSPECTION METHOD

CROSS-REFERENCE TO RELATED APPLICATION(S)

This application is based upon and claims the benefit of priority from Japanese Patent Application No. 2019-034801, filed Feb. 27, 2019, the entire contents of which are incorporated herein by reference.

FIELD

Embodiments described herein relate generally to semiconductor defect inspection apparatuses and semiconductor defect inspection methods.

BACKGROUND

As an apparatus that inspects a semiconductor chip formed on a semiconductor substrate for a defect, a transmission X-ray inspection apparatus is known. Examples of related art include JP-A-2004-093511.

DESCRIPTION OF THE DRAWINGS

FIG. 6 is a flowchart showing an example of procedures of a fluorescent X-ray inspection according to an embodiment of the present disclosure;

DETAILED DESCRIPTION

Embodiments provide a semiconductor defect inspection apparatus and a semiconductor defect inspection method, the apparatus and the method which can increase the sensitivity for detection of a defect.

In general, according to one embodiment, a semiconductor defect inspection apparatus includes: a stage on which an inspection target object is placed; an X-ray irradiation unit that irradiates the stage with X-rays; a transmission X-ray detection unit that detects transmitted X-rays which passed through the inspection target object; and a fluorescent X-ray detection unit that detects fluorescent X-rays which are emitted from the inspection target object by irradiation with the X-rays. Furthermore, the semiconductor defect inspection apparatus also includes a defect detection unit that detects a first defect by an analysis of a transmission X-ray image which is obtained by performing photoelectric conversion of the transmitted X-rays and detects a second defect by a spectrum analysis of the fluorescent X-rays.

According to another embodiment, a semiconductor defect inspection method irradiates an inspection target object placed on a stage with X-rays, detects, as transmitted X-rays, the X-rays which passed through the inspection target object, detects fluorescent X-rays generated from the inspection target object by irradiation with the X-rays, detects a first defect by an analysis of a transmission X-ray image which is obtained by performing photoelectric conversion of the transmitted X-rays, detects a second defect by a spectrum analysis of the fluorescent X-rays, and determines that a defect is present in the inspection target object if the first defect or the second defect is detected.

Hereinafter, embodiments will be described with reference to the drawings.

First Embodiment

Figure 1:
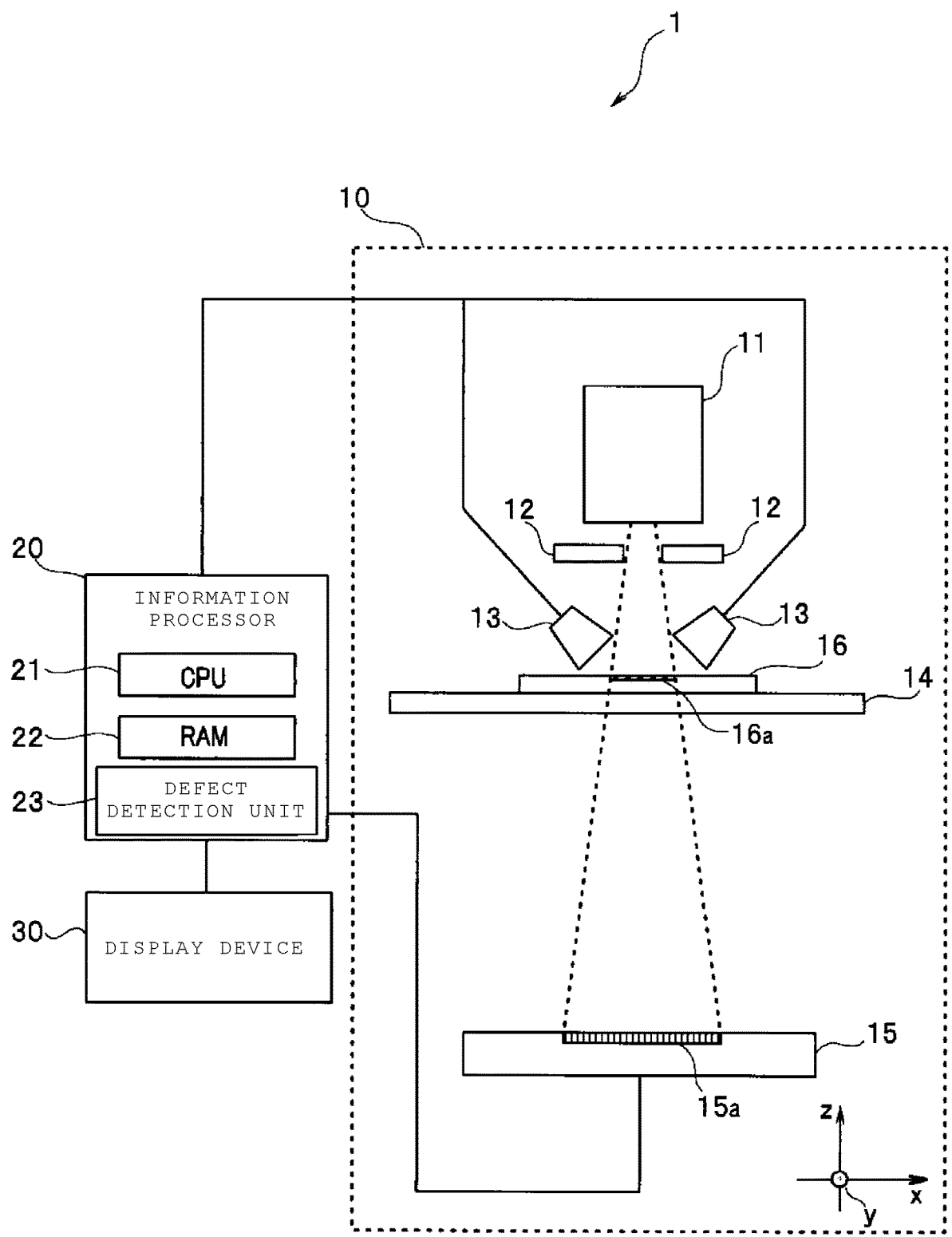
FIG. 1 is a block diagram depicting a configuration example of a semiconductor defect inspection apparatus according to a first embodiment of the present disclosure.

FIG. 1 is a block diagram depicting a configuration example of a semiconductor defect inspection apparatus according to a first embodiment of the present disclosure. A semiconductor defect inspection apparatus 1 of the present embodiment includes an X-ray inspection apparatus 10 and an information processor 20 and is used to detect a defect in a semiconductor device (for example, an electric circuit formed on a silicon wafer) which is an inspection target object 16. The semiconductor defect inspection apparatus 1 may further include a display device 30 that is made to display information on the detected defect, data acquired during an inspection, and the like.

In some embodiments, the X-ray inspection apparatus 10 may be referred to as an enlargement and projection inspection apparatus. The X-ray inspection apparatus 10 may include an X-ray irradiation unit 11, a collimator 12, a fluorescent X-ray detection unit 13, an object-under-examination stage 14, and an imaging unit 15. The X-ray irradiation unit 11 is configured with a predetermined X-ray tube. The X-ray tube emits X-rays, which are generated as a result of, for example, thermoelectrons generated from a filament (a cathode) in the tube being accelerated by a voltage applied between the filament (the cathode) and a target (an anode) and colliding with tungsten (W), molybdenum (Mo), chromium (Cr), or the like which is the target, from a window such as beryllium foil as primary X-rays. The X-rays emitted from the X-ray irradiation unit 11 are applied to the inspection target object 16 placed on the object-under-examination stage 14.

The collimator 12 is disposed between the X-ray irradiation unit 11 and the object-under-examination stage 14. The collimator 12 prevents scattered radiation of the X-rays, which may be emitted from the X-ray irradiation unit 11, from being applied to the inspection target object 16 and narrow an X-ray irradiation area in the inspection target object 16. The X-rays narrowed by the collimator 12 are applied to an imaging region 16a of the inspection target object 16.

The object-under-examination stage 14 is disposed between the collimator 12 and the imaging unit 15. The object-under-examination stage 14 is movable, by a driving unit such as an unillustrated motor, in two directions (an x direction and a y direction) which are perpendicular to each other and parallel to the front surface of the object-under-examination stage 14 and moving in a direction (a z direction) perpendicular to the front surface of the object-under-examination stage 14. By moving the object-under-examination stage 14 in any one of the x direction and the y direction or both, the imaging region 16a that is an X-ray irradiation area in the inspection target object 16 can be moved. Moreover, by moving the object-under-examination stage 14 in the z direction which is a vertical direction with respect to the front surface of the object-under-examination stage 14, the enlargement ratio for an image of the inspection target object 16, whose image is to be taken by the imaging unit 15, can be changed. That is, the enlargement ratio for the image can be increased by reducing the distance between the X-ray irradiation unit 11 and the inspection target object 16 by moving the object-under-examination stage 14 in the direction of the X-ray irradiation unit 11; the enlargement ratio for the image can be decreased by increasing the distance between the X-ray irradiation unit 11 and the inspection target object 16 by moving the object-under-examination stage 14 in the direction of the imaging unit 15.

The imaging unit 15 as a transmission X-ray detection unit includes a plurality of semiconductor detection devices (such as solid-state imaging devices) arranged in the form of a two-dimensional array. As the semiconductor detection device, a charge-coupled device (CCD) or a CMOS image sensor, for instance, is used. The X-rays which passed through the imaging region 16a of the inspection target object 16 are converted into fluorescence (a visible light image) by a predetermined fluorescent screen which is not depicted in the drawing, and the fluorescence is then subjected to photoelectric conversion by the semiconductor detection devices disposed in a projection region 15a of the imaging unit 15 and output to the information processor 20 as an imaging signal (a transmission X-ray image).

The fluorescent X-ray detection unit 13 is disposed between the X-ray irradiation unit 11 and the object-under-examination stage 14. As the fluorescent X-ray detection unit 13, a semiconductor detection device such as a silicon device, for example, is used. The fluorescent X-ray detection unit 13 detects fluorescent X-rays which are generated from the imaging region 16a of the inspection target object 16 by the X-rays emitted from the X-ray irradiation unit 11 and outputs, to the information processor 20, a current value proportional to the energy of the detected fluorescent X-rays. As the fluorescent X-ray detection unit 13, a detection device other than the semiconductor detection device, for example, a proportional counter tube or the like may be used. Moreover, the fluorescent X-ray detection unit 13 is desirably disposed near the imaging region 16a to detect as many fluorescent X-rays, which are generated from the imaging region 16a, as possible.

The information processor 20 is, for example, a computer and includes a central processing unit (CPU) 21, RAM 22, and a defect detection unit 23. The information processor 20 analyzes data (e.g., the transmission X-ray image which is output from the imaging unit 15 and the current value which is output from the fluorescent X-ray detection unit 13) which is input from the X-ray inspection apparatus 10 and detects a defect in the inspection target object 16. In addition to detecting a defect, the information processor 20 may, for example, control the X-ray inspection apparatus 10 such as position adjustment control of the object-under-examination stage 14. The CPU 21 operates in accordance with a program stored in unillustrated memory and controls each unit of the information processor 20. The RAM 22 stores data which is input from the X-ray inspection apparatus 10 and stores the detection result obtained in the defect detection unit 23.

The defect detection unit 23 makes a first defect determination using the transmission X-ray image which is output from the imaging unit 15 and a second defect determination using a fluorescent X-ray spectrum that is generated based on the current value which is output from the fluorescent X-ray detection unit 13, and makes defect detection determination in the inspection target object 16 from the result of the first defect determination and the result of the second defect determination. The defect detection unit 23 determines the presence or absence of a small-scale defect (e.g., a defect whose proportion to the area of the imaging region 16a is small, for example, less than a half of the area of the imaging region 16a, and whose brightness difference from a normal portion is large) by the first defect determination. Moreover, the defect detection unit 23 determines the presence or absence of a large-scale defect (a defect whose proportion to the area of the imaging region 16a is large, for example, a half or more than a half of the area of the imaging region 16a, and whose brightness difference from a normal portion is small) by the second defect determination. Specific methods of the first defect determination, the second defect determination, and final defect detection will be described in detail later. By storing an operation in the defect detection unit 23 in the unillustrated memory as a program in advance and executing the program in the CPU 21, defect detection may be made in a software manner. It should be appreciated that the defect detection unit 23 and other components according to the present embodiment may be implemented by hardware or software. As for hardware, as appropriate, it may be a circuit (e.g., circuitry of a CPU, GPU, FPGA, or other processing circuits implemented using electronic circuits), or a processor (e.g., CPU, GPU and the like) with a memory configured to implement the identified components herein. In addition, known irradiators, detectors, or the like may be used.

Figure 2:
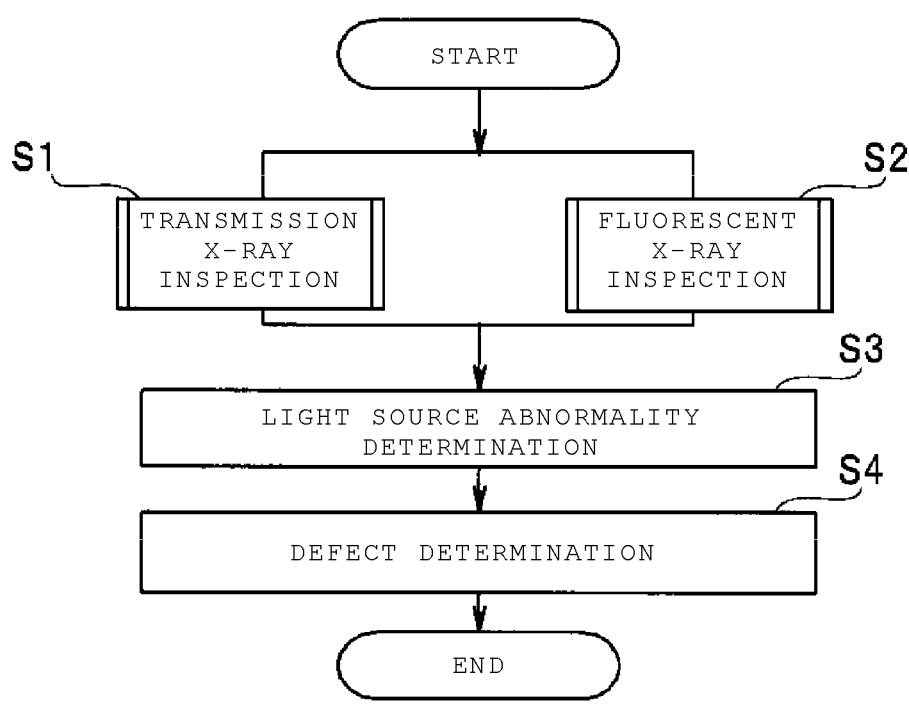
FIG. 2 is a flowchart showing an example of procedures of a semiconductor defect inspection method according to an embodiment of the present disclosure.

Procedures of a semiconductor defect inspection method in an embodiment of the present disclosure will be described in relation to FIG. 2. By executing the procedures shown in FIG. 2, a determination of the presence or absence of a defect in the imaging region 16a of the inspection target object 16 can be made. Prior to the execution of the procedures of FIG. 2, an object (hereinafter referred to as a reference object) which has the same structure as the inspection target object 16 and has no defect is assumed to be prepared or data (the transmission X-ray image and the fluorescent X-ray spectrum) obtained by inspecting the reference object by the X-ray inspection apparatus 10 is assumed to be stored in the RAM 22.

First, a transmission X-ray inspection (S1) and a fluorescent X-ray inspection (S2) are conducted. Since a transmission X-ray image of the inspection target object 16 and fluorescent X-rays which are generated from the inspection target object 16 can be acquired at the same time when the inspection target object 16 (or the reference object) is irradiated with the X-rays, S1 and S2 can be concurrently performed.

Figure 3:
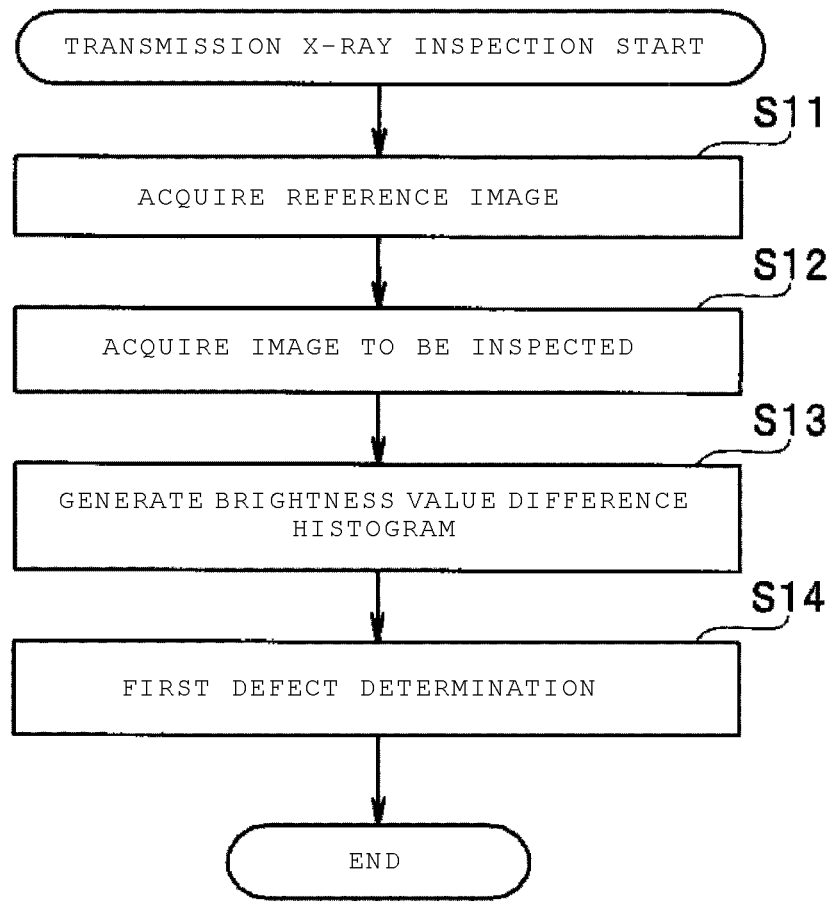
FIG. 3 is a flowchart showing an example of procedures of a transmission X-ray inspection according to an embodiment of the present disclosure.

Procedures of the transmission X-ray inspection in S1 will be described in relation to FIG. 3. FIG. 3 is a flowchart showing an example of the procedures of the transmission X-ray inspection according to an embodiment of the present disclosure.

First, the reference object is placed on the object-under-examination stage 14 and the object-under-examination stage 14 is adjusted so that a region of the reference object with the same structure as a region to be inspected in the inspection target object 16 is located in the imaging region 16a. Then, the reference object is irradiated with the X-rays from the X-ray irradiation unit 11 and a transmission X-ray image is acquired in the imaging unit 15 (S11). The acquired transmission X-ray image is input to the information processor 20 and stored in the RAM 22. If the transmission X-ray image of the reference object is acquired in advance, this step can be omitted.

Next, the inspection target object 16 is placed on the object-under-examination stage 14 and the object-under-examination stage 14 is adjusted so that a region to be inspected is located in the imaging region 16a. Then, the inspection target object 16 is irradiated with the X-rays from the X-ray irradiation unit 11 and a transmission X-ray image is acquired in the imaging unit 15 (S12).

Figure 4A:
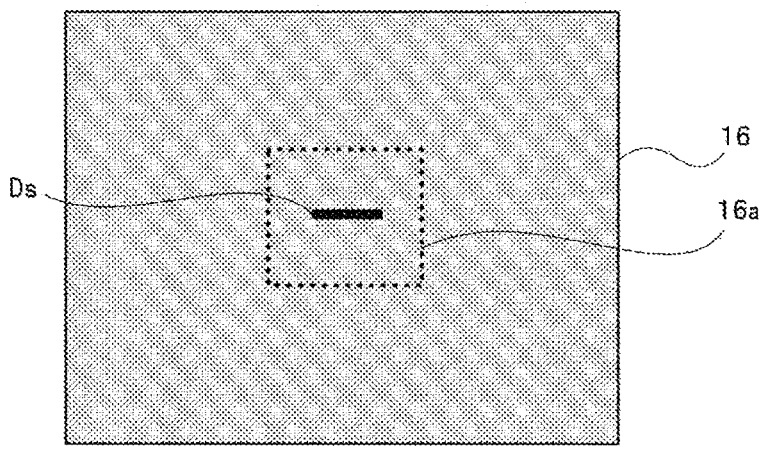
FIG. 4A is an example of a transmission X-ray image of a first inspection target object.
Figure 4B:
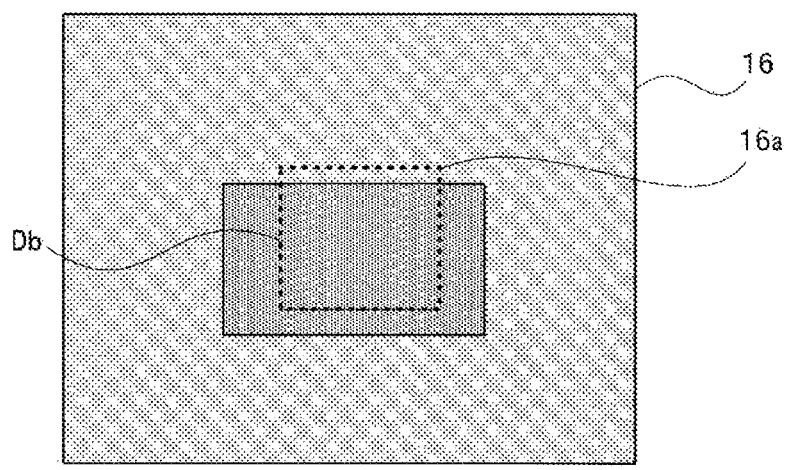
FIG. 4B is an example of a transmission X-ray image of a second inspection target object.
Figure 4C:
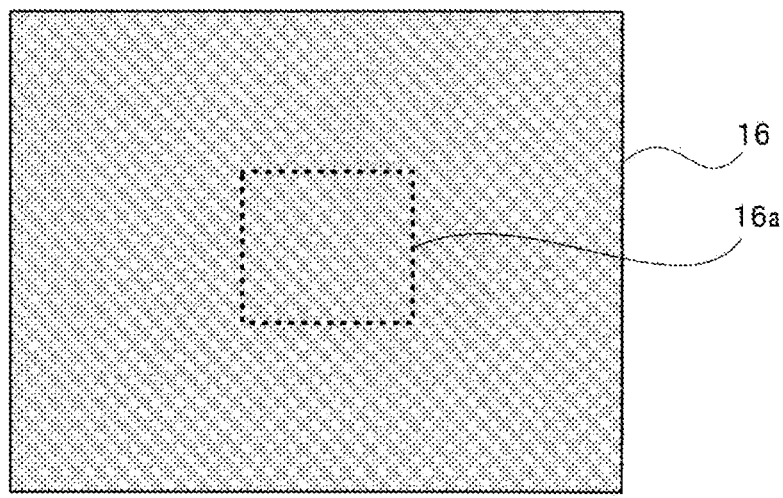
FIG. 4C is an example of a transmission X-ray image of a reference object.

FIGS. 4A and 4B are each an example of a transmission X-ray image of an inspection target object. FIG. 4A is a transmission X-ray image of an inspection target object in which a small-scale defect is present (hereinafter referred to as a first inspection target object), and FIG. 4B is a transmission X-ray image of an inspection target object in which a large-scale defect is present (hereinafter referred to as a second inspection target object). Moreover, FIG. 4C is an example of a transmission X-ray image of the reference object. In the following description, the transmission X-ray image of the first inspection target object is written as the image of the first inspection target object, the transmission X-ray image of the second inspection target object is written as the image of the second inspection target object, and the transmission X-ray image of the reference object is written as the reference image.

As depicted in FIG. 4C, for example, in the reference object in which a defect is not present, the brightness of all the pixels in the imaging region 16a is nearly uniform. In contrast, in the first inspection target object which is depicted in FIG. 4A, a defect region Ds whose area is about a few percent of the area of the imaging region 16a is present in the imaging region 16a which is an inspection region and the brightness difference between a pixel in the defect region Ds and a pixel in the reference object in the same position is large. In the second inspection target object which is depicted in FIG. 4B, a defect region Db whose area is about 90 percent of the area of the imaging region 16a is present in the imaging region 16a which is an inspection region. The brightness difference between a pixel in the defect region Db and a pixel in the reference object in the same position is small.

Figure 5A:
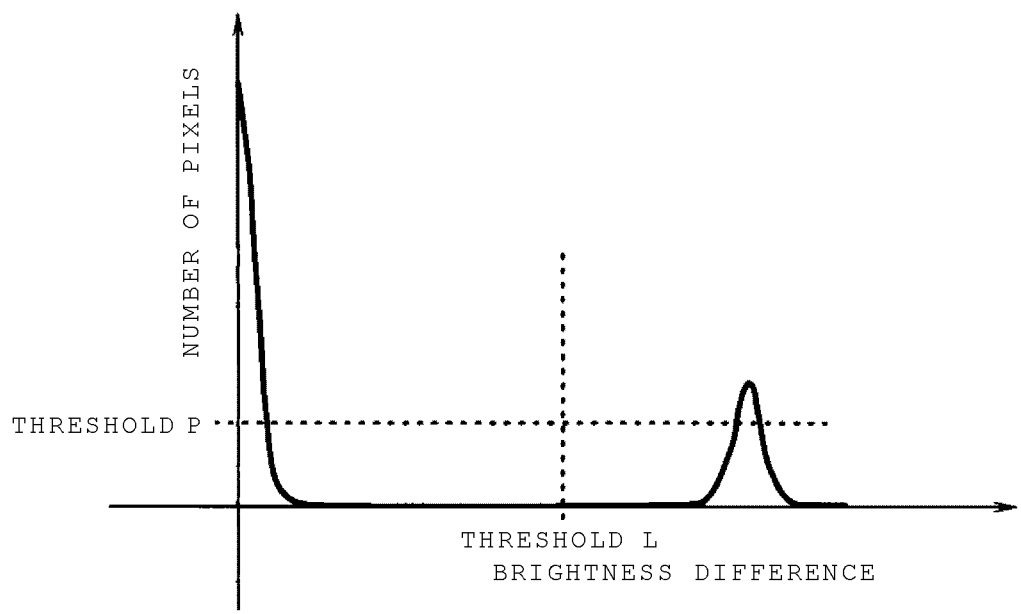
FIG. 5A is a brightness value difference histogram of the transmission X-ray image of the first inspection target object and the transmission X-ray image of the reference object.
Figure 5B:
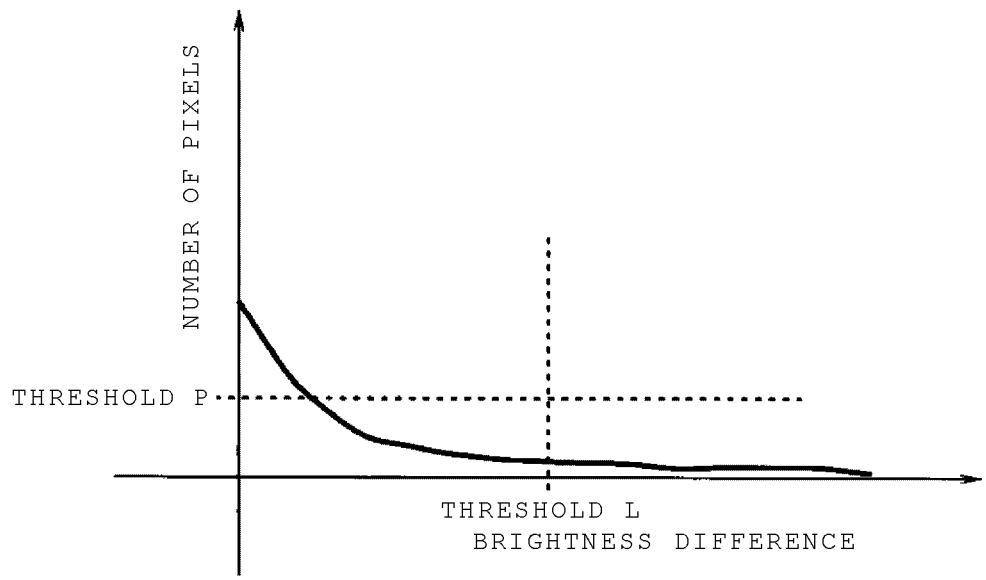
FIG. 5B is a brightness value difference histogram of the transmission X-ray image of the second inspection target object and the transmission X-ray image of the reference object.

Then, for each pixel of the reference image and each pixel of the transmission X-ray image of the inspection target object 16, a difference in brightness value between pixels in the same position is calculated and the distribution of brightness differences between pixels of the images in their entirety is generated (S13). FIGS. 5A and 5B are each an example of a brightness value difference histogram of the reference image and the transmission X-ray image of the inspection target object. FIG. 5A is a brightness value difference histogram observed when the inspection target object 16 is the first inspection target object, that is, a brightness value difference histogram of the reference image and the image of the first inspection target object. FIG. 5B is a brightness value difference histogram observed when the inspection target object 16 is the second inspection target object, that is, a brightness value difference histogram of the reference image and the image of the second inspection target object.

As shown in FIG. 5A, in the brightness value difference histogram of the reference image and the image of the first inspection target object, while a distribution caused by a measurement error or noise is present in a region in which a brightness difference is small, a clear peak is present in a region in which a brightness difference is large, that is, a region corresponding to a difference between the brightness value of a pixel in the defect region Ds of the image of the first inspection target object and the brightness value of a pixel in the reference image in the same position. On the other hand, as shown in FIG. 5B, the brightness value difference histogram of the reference image and the image of the second inspection target object shows, as a result of a distribution caused by a difference between the brightness value of a pixel in the defect region Db and the brightness value of a pixel in the reference image in the same position overlapping with a distribution caused by a measurement error or noise which is present in a region in which a brightness difference is small, a distribution sloping from top left to bottom right in a smooth curve, indicating a gradual reduction in a rate of decrease.

Based on the brightness difference distribution generated in S13, the first defect determination is made (S14). For example, a determination is made that a defect is present in the inspection target object 16 if the peak value of the distribution of pixels exceeds a threshold P, which is set in advance, in a region in which the brightness difference exceeds a threshold L, which is set in advance, in the brightness difference distribution generated in S13. The threshold L and the threshold P are values set before the inspection with consideration of noise, a measurement error, and variations in brightness value from pixel to pixel in the inspection target object 16 and the reference object, among others.

In the brightness value difference histogram, which is shown in FIG. 5A, of the reference image and the image of the first inspection target object, a peak caused by the defect region Ds of the image of the first inspection target object is present in a region in which the brightness difference exceeds the threshold L, and the peak value exceeds the threshold P. Thus, when the transmission X-ray inspection is conducted on the first inspection target object, a defect is detected. On the other hand, in the brightness value difference histogram, which is shown in FIG. 5B, of the reference image and the image of the second inspection target object, a peak value exceeding the threshold P is not present in a region in which the brightness difference exceeds the threshold L. Thus, even when the transmission X-ray inspection is conducted on the second inspection target object, a defect is not detected.

As described above, by executing a series of procedures from S11 to S14 shown in FIG. 3, a small-scale defect present in the inspection target object 16 can be detected.

Referring again to FIG. 2, procedures of the fluorescent X-ray inspection in S2 will be described in relation to FIG. 6. FIG. 6 is a flowchart showing an example of the procedures of the fluorescent X-ray inspection according to an embodiment of the present disclosure. The fluorescent X-ray inspection is conducted concurrently with the above-described transmission X-ray inspection.

First, the reference object is placed on the object-under-examination stage 14 and the object-under-examination stage 14 is adjusted so that a region of the reference object with the same structure as a region to be inspected in the inspection target object 16 is located in the imaging region 16a. Then, the reference object is irradiated with the X-rays from the X-ray irradiation unit 11, fluorescent X-rays which are generated from the imaging region 16a of the reference object are detected in the fluorescent X-ray detection unit 13, and a current value proportional to the energy of the detected fluorescent X-rays is acquired. The acquired current value is input to the information processor 20, and the fluorescent X-ray spectrum of the reference object is generated (S21). The generated fluorescent X-ray spectrum is stored in the RAM 22. If detection of the fluorescent X-rays which are generated from the reference object is made in advance, this step can be omitted. Moreover, by executing the procedure in S11 in the transmission X-ray inspection, the process from the placement of the reference object to irradiation of the reference object with the X-rays in S21 is concurrently executed.

Next, the inspection target object 16 is placed on the object-under-examination stage 14 and the object-under-examination stage 14 is adjusted so that a region to be inspected is located in the imaging region 16a. Then, the inspection target object 16 is irradiated with the X-rays from the X-ray irradiation unit 11, fluorescent X-rays which are generated from the imaging region 16a of the inspection target object 16 are detected in the fluorescent X-ray detection unit 13, and a current value proportional to the energy of the detected fluorescent X-rays is acquired. The acquired current value is input to the information processor 20, and the fluorescent X-ray spectrum of the inspection target object 16 is generated (S22). The generated fluorescent X-ray spectrum is stored in the RAM 22.

Figure 7A:
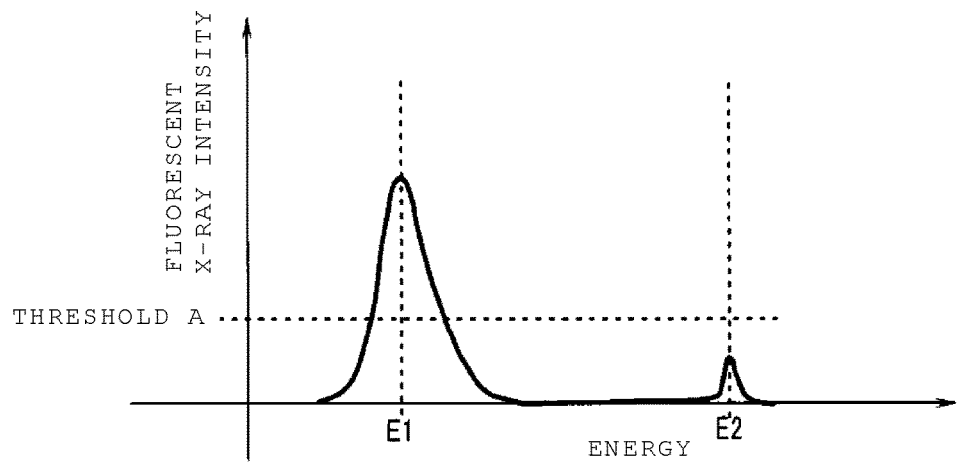
FIG. 7A is an example of the fluorescent X-ray spectrum of the first inspection target object.
Figure 7B:
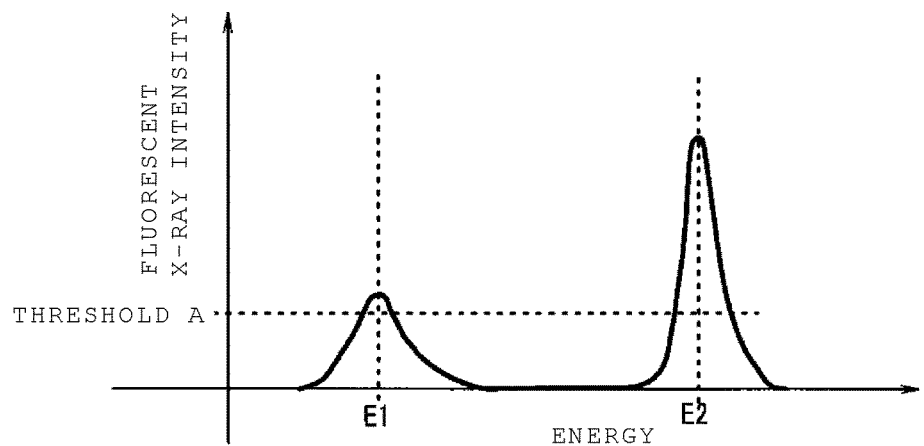
FIG. 7B is an example of the fluorescent X-ray spectrum of the second inspection target object.

FIGS. 7A and 7B are each an example of the fluorescent X-ray spectrum of the inspection target object. FIG. 7A is the fluorescent X-ray spectrum of the first inspection target object, and FIG. 7B is the fluorescent X-ray spectrum of the second inspection target object. Moreover, FIG. 7C is an example of the fluorescent X-ray spectrum of the reference object.

Figure 7C:
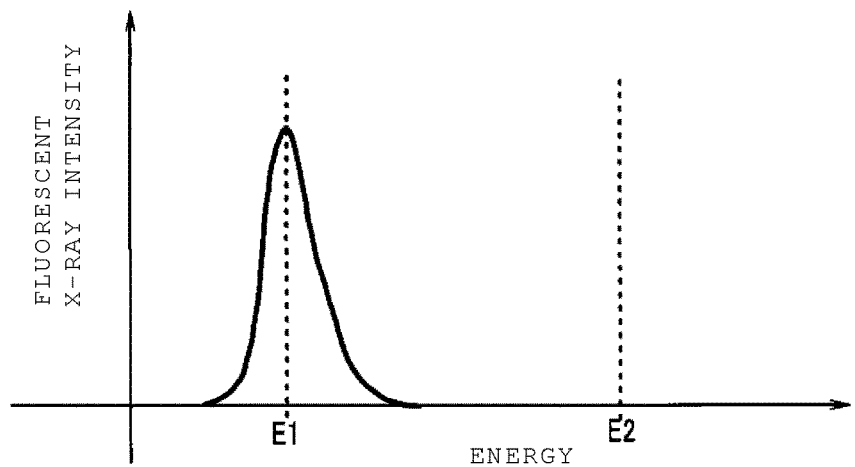
FIG. 7C is an example of the fluorescent X-ray spectrum of the reference object.

As shown in FIG. 7C, the fluorescent X-ray spectrum of the reference object in which a defect is not present, for example, is a spectrum with a peak at the energy (E1) specific to an element (for example, silicon (Si)) which makes up the reference object, whereas, the fluorescent X-ray spectrum of the first inspection target object which is shown in FIG. 7A is a spectrum with a peak also at the energy (E2) specific to an element (an element other than an element which makes up the reference object; hereinafter referred to as a defect constituent element) contained in the defect region Ds. Examples of the defect constituent element in the semiconductor device are tungsten (W), aluminum (Al), and titanium (Ti). These elements are often used as wiring in the semiconductor device and can cause poor pattern formation or the like.

Likewise, the fluorescent X-ray spectrum of the second inspection target object which is shown in FIG. 7B is a spectrum with a peak also at the energy (E2) specific to a defect constituent element contained in the defect region Db. The peak value at the energy specific to a defect constituent element is nearly proportional to the amount of a defect constituent element contained in each of the defect regions Ds and Db. The amount of a defect constituent element in the second inspection target object with a large-scale defect is larger than the amount of a defect constituent element in the first inspection target object with a small-scale defect. For this reason, as shown in FIGS. 7A and 7B, the peak value at the energy specific to a defect constituent element in the second inspection target object is larger than the peak value at the energy specific to a defect constituent element in the first inspection target object.

Then, the fluorescent X-ray spectrum of the reference object and the fluorescent X-ray spectrum of the inspection target object 16 are compared with each other and the presence or absence of a peak at energy other than the energy specific to an element which makes up the reference object is detected (S23).

Finally, based on the peak of the fluorescent X-ray spectrum detected in S23, the second defect determination is made (S24). For example, if the detected peak value exceeds a threshold A which is set in advance, a determination is made that a defect is present in the inspection target object 16. The threshold A is a value set before the inspection with consideration of noise, a measurement error, among others. In the fluorescent X-ray spectrum, which is shown in FIG. 7B, of the second inspection target object, the peak value at the energy (E2) specific to a defect constituent element also exceeds the threshold A. Thus, when the fluorescent X-ray inspection is conducted on the second inspection target object, a defect is detected. As described above, by executing a series of procedures from S21 to S24 shown in FIG. 6, a large-scale defect present in the inspection target object 16 can be detected.

Referring again to FIG. 2, after the transmission X-ray inspection (S1) and the fluorescent X-ray inspection (S2) are conducted by the above procedures, a light source abnormality determination is made (S3). In the light source abnormality determination, a determination of an abnormality or degradation of a light source in the X-ray irradiation unit 11 is made based on the result of the transmission X-ray inspection in S1 and the result of the fluorescent X-ray inspection in S2. Prior to the light source abnormality determination, any of the elements present in the inspection target object 16, which are specific elements that can be detected by the fluorescent X-ray inspection, is set as an "determination target element" (for example, tungsten (W)). Then, a calibration curve which is used for the light source abnormality determination is generated. The determination target element is not limited to one type of element; a plurality of determination target elements may be set and a calibration curve may be generated for each element.

Figure 8:
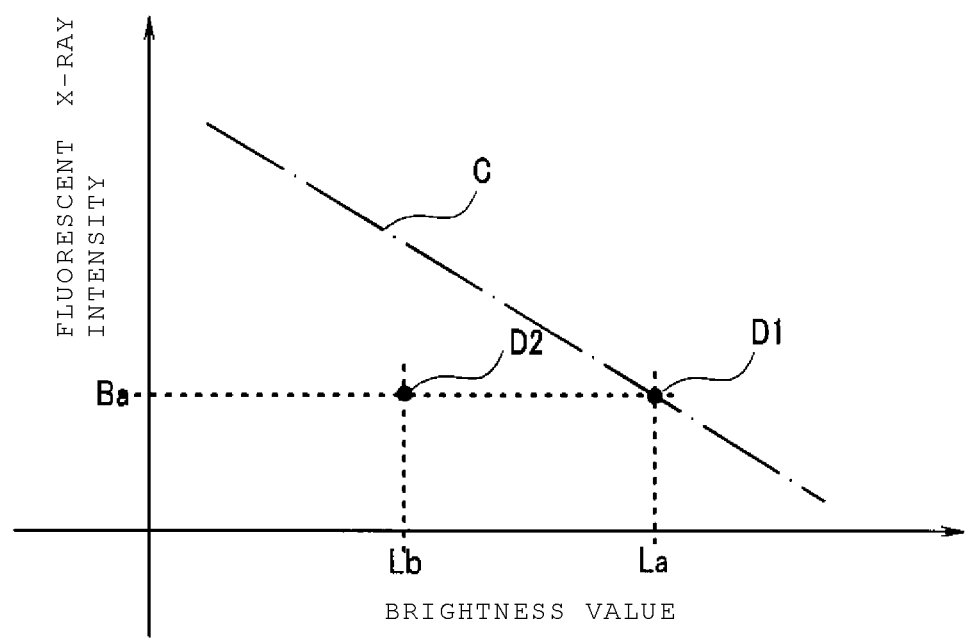
FIG. 8 is a diagram showing the correlation between the brightness value of a transmission X-ray image and the fluorescent X-ray intensity.

The generation of a calibration curve is performed in the following manner. Several types of inspection target objects 16 with different contents of a determination target element (hereinafter written as base objects) are prepared, and the transmission X-ray inspection and the fluorescent X-ray inspection of the base objects are conducted using a light source without abnormalities and degradation. For each base object, the mean brightness value of a transmission X-ray image which is obtained by the transmission X-ray inspection and the peak value of the fluorescent X-ray intensity at the energy specific to the determination target element, which is obtained by the fluorescent X-ray inspection, are calculated. Then, by generating a correlation curve (a straight line) by plotting the measurement values of the base objects on a graph, as shown in FIG. 8, with the brightness value of a transmission X-ray image on the horizontal axis and the fluorescent X-ray intensity on the vertical axis, a calibration curve is obtained. FIG. 8 is a diagram showing the correlation between the brightness value of a transmission X-ray image and the fluorescent X-ray intensity. In FIG.

8, a straight line C indicated by an alternate long and short dashed line represents a calibration curve generated by using the base objects.

Referring again to S3 of FIG. 2, on the correlation diagram, which is shown in FIG. 8, of the brightness value of a transmission X-ray image and the fluorescent X-ray intensity, an intersection point of the mean brightness value of the transmission X-ray image of the inspection target object 16 acquired in S1 and the peak value of the fluorescent X-ray intensity, which was acquired in S2, at the energy, which is specific to the determination target element, of the inspection target object 16 is plotted. If the plotted point is located in a region below the calibration curve, a determination is made that the light source is abnormal.

For instance, for one inspection target object, if the mean brightness value of the transmission X-ray image is La and the peak value of the fluorescent X-ray intensity at the energy specific to the determination target element is Ba, the measurement value is plotted at a point D1. Since the point D1 is located on the calibration curve C, a determination is made that there is no abnormality in the light source at the time of inspection of this inspection target object. On the other hand, for another inspection target object, if the mean brightness value of the transmission X-ray image is Lb and the peak value of the fluorescent X-ray intensity at the energy specific to the determination target element is Ba, the measurement value is plotted at a point D2. Since the point D2 is located below the calibration curve C, a determination is made that there is an abnormality or degradation in the light source at the time of inspection of this inspection target object.

If a determination is made in S3 that there is an abnormality or degradation in the light source, after the light source is restored to a normal state by being adjusted or replaced, the defect inspection is executed again. When the distance between the measurement point and the calibration curve C is small, a re-inspection may not be performed and replacement or adjustment of the light source may be performed before the inspection of the next inspection target object 16. Alternatively, when, for example, a plurality of inspection target objects 16 are inspected consecutively, a change in the measurement point may be monitored over time and measures may be determined in accordance with the degree of change.

After S3, a defect determination is made at the end of the procedures (S4). In the defect determination, if a defect is detected in the transmission X-ray inspection in S1 or the fluorescent X-ray inspection in S2, a determination is made that a defect is present in the inspection target object 16. At this time, if a defect is detected in the transmission X-ray inspection, a determination is made that a small-scale defect is present. Moreover, if a defect is not detected in the transmission X-ray inspection and a defect is detected in the fluorescent X-ray inspection, a determination is made that a large-scale defect is present. Upon completion of the defect determination in S4, a series of processing of the semiconductor defect inspection of the present embodiment is finished.

As described above, according to the present embodiment, the imaging unit 15 that detects the transmitted X-rays and the fluorescent X-ray detection unit 13 that detects the fluorescent X-rays are provided in the X-ray inspection apparatus 10. As a result, when the inspection target object 16 is irradiated with the X-rays from the X-ray irradiation unit 11, both a transmission X-ray image and a fluorescent X-ray spectrum can be concurrently acquired. Thus, since a large-scale defect, whose detection by using a transmission X-ray image is difficult, can be detected by a fluorescent X-ray spectrum, the sensitivity for detection of a defect can be increased.

Moreover, as a transmission X-ray image and a fluorescent X-ray spectrum can be concurrently acquired, an abnormality or degradation of the light source of the X-ray irradiation unit 11 can be detected by checking, against the calibration curve, the mean brightness value of the transmission X-ray image of the inspection target object 16 and the peak value of the fluorescent X-ray intensity at the energy specific to the determination target element and a reduction in the accuracy of detection of a defect can be prevented.

In the above description, a reference value, which is used for a comparison with the measurement value of an inspection target object in the first defect determination in the transmission X-ray inspection and the second defect determination in the fluorescent X-ray inspection, is set by using a golden die system in which the reference value is acquired from a reference object without a defect; the reference value may be set by using other systems which are commonly used for defect detection, such as using the measurement value of the inspection target object measured immediately before the inspection target object in current measurement or the mean of the measurement values of a plurality of inspection target objects.

Second Embodiment

Next, a semiconductor defect inspection apparatus according to a second embodiment of the present disclosure will be described. A semiconductor defect inspection apparatus 1A of the present embodiment differs from the semiconductor defect inspection apparatus 1 of the above-described first embodiment in the configuration of an X-ray inspection apparatus 10A. Since other configurations and a defect inspection method are the same as the configurations and the defect inspection method of the above-described first embodiment, explanations thereof will be omitted and only a point in which the second embodiment differs from the first embodiment will be described.

Figure 9:
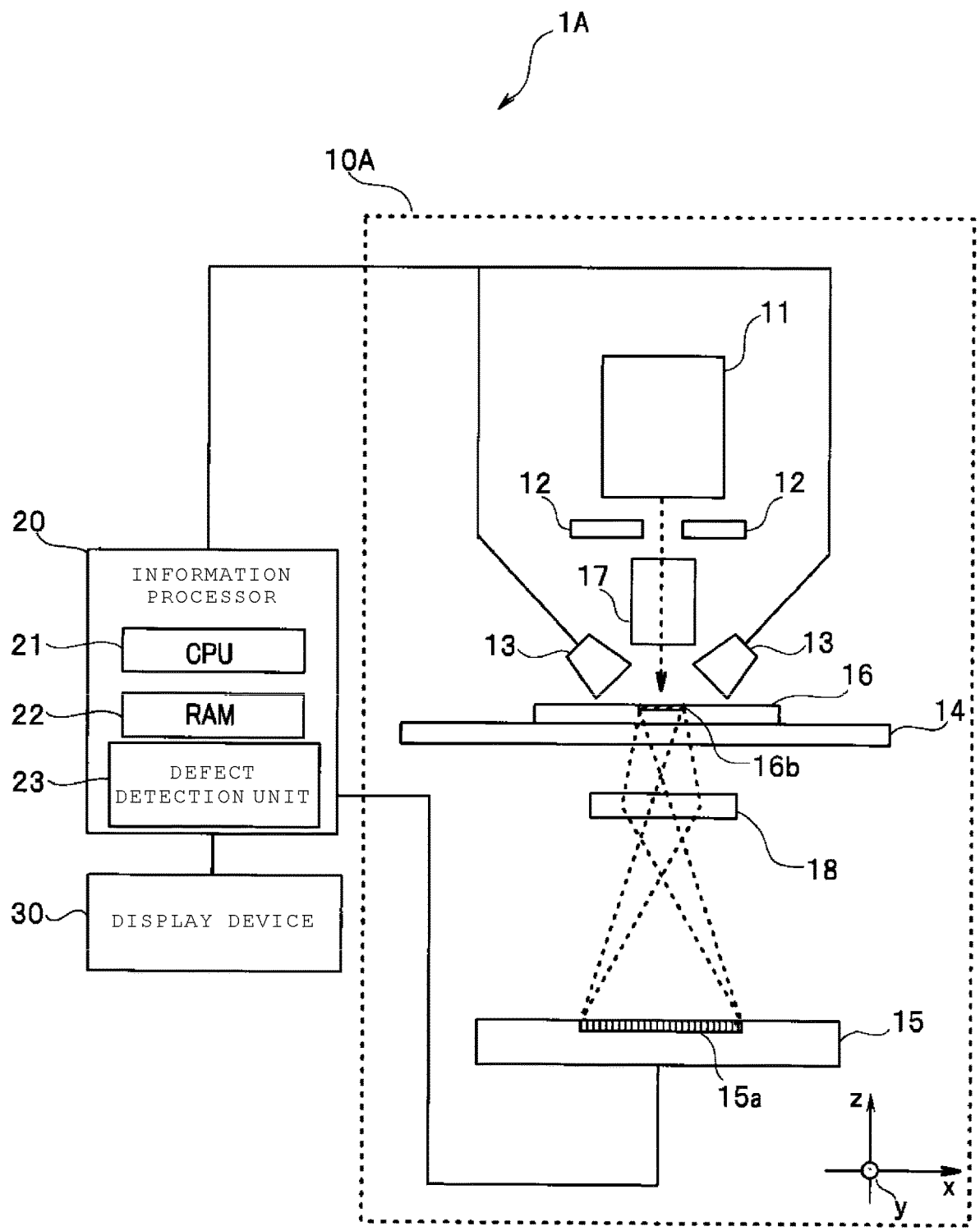
FIG. 9 is a block diagram depicting a configuration example of a semiconductor defect inspection apparatus according to a second embodiment of the present disclosure.

FIG. 9 is a block diagram depicting a configuration example of the semiconductor defect inspection apparatus 1A according to the second embodiment of the present disclosure. The X-ray inspection apparatus 10A of the present embodiment differs from the X-ray inspection apparatus 10 of the first embodiment in that a light collecting mirror 17 is provided between the collimator 12 and the object-under-examination stage 14 and an X-ray focusing device 18 is provided between the object-under-examination stage 14 and the imaging unit 15.

The light collecting mirror 17 collects the X-rays emitted from the X-ray irradiation unit 11 to narrow an X-ray irradiation area in the inspection target object 16. Thus, an imaging region 16b of the X-ray inspection apparatus 10A of the present embodiment is a region smaller than the imaging region 16a in the X-ray inspection apparatus 10 of the first embodiment.

The X-ray focusing device 18 is a light focusing device for forming an image on the projection region 15a of the imaging unit 15 by focusing the X-rays passing through the imaging region 16b of the inspection target object 16. For example, a diffraction light focusing device such as an FZP and a reflection light focusing device such as a K-B mirror can be used.

The X-ray inspection apparatus 10A using the light collecting mirror 17 and the X-ray focusing device 18 is what is called an image-forming inspection apparatus and can conduct an inspection at higher magnification (higher resolution) than the enlargement and projection X-ray inspection apparatus 10 described in the first embodiment; while on the other hand, since the imaging region 16b is small, compared to the imaging region 16a, the size of a defect on the inspection target object 16 is relatively large. As a result, the incidence of a large-scale defect is increased.

However, according to the present embodiment, by providing the fluorescent X-ray detection unit 13 that detects the fluorescent X-rays in a space, in which the light collecting mirror 17 is disposed, between the collimator 12 and the object-under-examination stage 14, a large-scale defect can be detected without a reduction in resolution and the sensitivity for detection of a defect can be increased.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor defect inspection apparatus comprising:
    a stage for holding an inspection target object;
    an X-ray irradiator configured to irradiate the stage with X-rays;
    a transmission X-ray detector configured to detect transmitted X-rays that pass through the inspection target object;
    a fluorescent X-ray detector configured to detect fluorescent X-rays which are emitted from the inspection target object; and
    a defect detector configured to detect a first defect by analysis of a transmission X-ray image which is obtained by performing photoelectric conversion of the transmitted X-rays and a second defect by analyzing a spectrum of the fluorescent X-rays,
    wherein the second defect has an area which is a half or more than a half of an area of a region that is irradiated with the X-rays, and
    wherein a brightness difference between a first pixel, corresponding to the second defect, in the transmission X-ray image of the inspection target object and a second pixel in a transmission X-ray image of a reference object is less than a preset threshold, the first and second pixels being in a same position.

2. The semiconductor defect inspection apparatus according to claim 1, wherein
    the fluorescent X-ray detector is disposed between the stage and the X-ray irradiator.

3. The semiconductor defect inspection apparatus according to claim 1, further comprising:
    a light collecting mirror disposed between the stage and the X-ray irradiator; and
    an X-ray focusing device disposed between the stage and the transmission X-ray detector.

4. The semiconductor defect inspection apparatus according to claim 1, wherein
    the defect detector is further configured to detect an abnormality in the X-ray irradiator based on a mean brightness value in the transmission X-ray image and fluorescent X-ray intensity at predetermined energy in a fluorescent X-ray spectrum.

5. A semiconductor defect inspection method, comprising:
    irradiating an inspection target object with X-rays;
    detecting the X-rays that pass through the inspection target object;
    detecting fluorescent X-rays generated from the inspection target object;
    detecting whether a first defect is present by an analysis of a transmission X-ray image obtained by performing photoelectric conversion of the transmitted X-rays;
    detecting whether a second defect is present by a spectrum analysis of the fluorescent X-rays; and
    determining that a defect is present in the inspection target object in response to detecting a presence of at least one of the first defect or the second defect,
    wherein the first defect has an area which is less than a half of an area of a region that is irradiated with the X-rays, and
    wherein detecting whether a first defect is present further comprises:
    determining whether a brightness difference between a first pixel, corresponding to the first defect, in the transmission X-ray image of the inspection target object and a second pixel in a transmission X-ray image of a reference object is greater than a preset threshold, the first and second pixels being in a same position.

6. The semiconductor defect inspection method according to claim 5, further comprising:
    detecting an abnormality in an X-ray irradiator irradiating the inspection target object with the X-rays based on a mean brightness value in the transmission X-ray image and fluorescent X-ray intensity at predetermined energy in a fluorescent X-ray spectrum.

7. The semiconductor defect inspection method of claim 5, wherein detecting whether a second defect is present further comprises:
    determining whether a brightness difference between a first pixel, corresponding to the second defect, in the transmission X-ray image of the inspection target object and a second pixel in a transmission X-ray image of a reference object is less than a preset threshold, the first and second pixels being in a same position.

8. The semiconductor defect inspection method of claim 5, wherein the second defect has an area which is a half or more than a half of an area of a region that is irradiated with the X-rays.

9. A system comprising:
    one or more processors programmed with machine-readable instructions to carry out control to:
    irradiate an inspection target object placed on a stage with X-rays;
    detect the X-rays which passed through the inspection target object are detected as transmitted X-rays;
    detect fluorescent X-rays generated from the inspection target object;
    detect whether a first defect is present by an analysis of a transmission X-ray image obtained by performing photoelectric conversion of the transmitted X-rays;
    detect whether a second defect is present by a spectrum analysis of the fluorescent X-rays; and
    determine that a defect is present in the inspection target object in response to detecting a presence of at least one of the first defect or the second defect, wherein the second defect has an area which is a half or more than a half of an area of a region that is irradiated with the X-rays, wherein a brightness difference between a first pixel, corresponding to the second defect, in the transmission X-ray image of the inspection target object and a second pixel in a transmission X-ray image of a reference object is less than a preset threshold, the first and second pixels being in a same position, wherein the first defect has an area which is less than a half of an area of a region that is irradiated with the X-rays, and wherein a brightness difference between a first pixel, corresponding to the first defect, in the transmission X-ray image of the inspection target object and a second pixel in a transmission X-ray image of a reference object is greater than a preset threshold, the first and second pixels being in a same position.

\* \* \* \* \*